US007335966B2

(12) United States Patent
Ihme et al.

(10) Patent No.: US 7,335,966 B2
(45) Date of Patent: Feb. 26, 2008

(54) CONFIGURABLE INTEGRATED CIRCUIT CAPACITOR ARRAY USING VIA MASK LAYERS

(75) Inventors: David Ihme, Clemmons, NC (US); James C. Kemerling, Lewisville, NC (US); William D. Cox, Chapel Hill, NC (US)

(73) Assignees: Triad Semiconductor, Inc., Winston-Salem, NC (US); ViASIC, Inc., Durham, NC (US)

( * ) Notice: Subject to any disclaimer, the term of this patent is extended or adjusted under 35 U.S.C. 154(b) by 0 days.

(21) Appl. No.: 10/906,527

(22) Filed: Feb. 23, 2005

(65) Prior Publication Data

US 2005/0189614 A1 Sep. 1, 2005

Related U.S. Application Data

(60) Provisional application No. 60/548,000, filed on Feb. 26, 2004.

(51) Int. Cl.
 *H01L 29/00* (2006.01)
(52) U.S. Cl. ............. 257/532; 257/528; 257/E27.048
(58) Field of Classification Search ............. 257/211, 257/758, 532, 528, E27.048
See application file for complete search history.

(56) References Cited

U.S. PATENT DOCUMENTS

| | | | |
|---|---|---|---|
| 4,641,108 A | 2/1987 | Gill, Jr. | |
| 4,734,654 A | 3/1988 | Fernandez | |
| 4,760,349 A | 7/1988 | Park et al. | |
| 5,317,919 A | 6/1994 | Awtrey | |
| 5,367,430 A | 11/1994 | DeVoe et al. | |
| 5,404,265 A | 4/1995 | Moresco et al. | |
| 5,459,634 A | 10/1995 | Nelson et al. | |
| 5,517,040 A | 5/1996 | Hedman et al. | |
| 5,590,016 A | 12/1996 | Fujishiro et al. | |
| 5,821,776 A | 10/1998 | McGowan et al. | |
| 5,883,423 A | 3/1999 | Patwa et al. | |
| 6,166,403 A * | 12/2000 | Castagnetti et al. | ........ 257/211 |
| 6,278,148 B1 | 8/2001 | Watanabe et al. | |

(Continued)

FOREIGN PATENT DOCUMENTS

EP 0 491 567 6/1992

(Continued)

OTHER PUBLICATIONS

Triad Semicondutor, Inc., *International Application Ser. No. PCT/US2005/005836*, "International Search Report", Aug. 1, 2005.

(Continued)

*Primary Examiner*—M. Wilczewski
*Assistant Examiner*—Tsz Chiu
(74) *Attorney, Agent, or Firm*—Womble Carlyle

(57) ABSTRACT

A semiconductor device having a plurality of layers and a capacitor array that includes a plurality of individual capacitors. At least one of the plurality of layers in the semiconductor device may be a via layer configured to determine the connections and capacitances of the plurality of individual capacitors in the capacitor array. The semiconductor device may include a metal structure disposed within the device to provide an electromagnetic shield for at least one of the plurality of individual capacitors in the capacitor array.

26 Claims, 7 Drawing Sheets

U.S. PATENT DOCUMENTS

| | | |
|---|---|---|
| 6,411,494 B1 | 6/2002 | Watt |
| 6,448,114 B1 | 9/2002 | An et al. |
| 6,467,074 B1 | 10/2002 | Katsioulas et al. |
| 6,476,695 B1 | 11/2002 | Nakamichi |
| 6,580,289 B2 * | 6/2003 | Cox ............................ 326/40 |
| 6,588,005 B1 | 7/2003 | Kobayashi et al. |
| 6,614,645 B1 | 9/2003 | Sakurai et al. |
| 6,646,323 B2 | 11/2003 | Dirnecker et al. |
| 6,646,860 B2 | 11/2003 | Takaramoto et al. |
| 6,982,454 B2 * | 1/2006 | Giuroiu et al. ............. 257/306 |
| 7,239,194 B2 | 7/2007 | Azrai et al. |
| 2002/0084509 A1 * | 7/2002 | Ballantine et al. .......... 257/531 |
| 2002/0085334 A1 | 7/2002 | Figueroa et al. |
| 2002/0186045 A1 * | 12/2002 | Cox ............................ 326/41 |
| 2004/0004241 A1 * | 1/2004 | Aton ........................... 257/306 |
| 2004/0129966 A1 | 7/2004 | Giuroiu et al. |

FOREIGN PATENT DOCUMENTS

| | | |
|---|---|---|
| EP | 0 499 383 | 8/1992 |

OTHER PUBLICATIONS

Triad Semiconductor, Inc, *International Application Ser. No. PCT/US2005/005836*, "Written Opinion", Aug. 1, 2005.

Triad Semiconductor, Inc., *International Application Ser. No. PCT/US2005/011361*, "International Search Report", Aug. 5, 2005.

Triad Semiconductor, Inc., *International Application Ser. No. PCT/US2005/011361*, "Written Opinion", Aug. 5, 2005.

Triad Semiconductor, Inc., "International Preliminary Report on Patentability," Jul. 6, 2006.

Triad Semiconductor, Inc., "International Preliminary Examination Report," Jul. 14, 2006.

* cited by examiner

CONFIGURABLE INTEGRATED CIRCUIT CAPACITOR ARRAY USING VIA MASK LAYERS

CROSS-REFERENCE TO RELATED APPLICATIONS

This application claims priority from co-pending provisional patent application Ser. No. 60/548,000, filed Feb. 26, 2004, by the inventors hereof, the entire disclosure of which is incorporated herein by reference.

BACKGROUND

A capacitor is a fundamental two-terminal electronic device that may be manufactured in an integrated circuit. However, in an integrated circuit, it is often difficult to realize a well controlled capacitance value. The variation that results from the processes involved in the fabrication of integrated circuits may cause the value of a given capacitor to change by as much as 30% from device to device. Hence, several smaller capacitors are most often used by connecting them in parallel to create one large capacitor. The accuracy of the combined capacitance of these smaller capacitors can be better than 0.1%. Therefore, an array of capacitors is commonly used in integrated circuits. A capacitor array contains a plurality of individual capacitors positioned in rows and columns to allow for the routing of signals within the integrated circuit. One type of capacitor used in an integrated circuit is a "poly-poly" capacitor, which uses a parallel-plate structure that includes two polysilicon layers.

FIG. 1 illustrates a side view of the semiconductor layers forming a standard poly-poly capacitor in an integrated circuit. The capacitor 100 is formed by the polysilicon layers 106 and 108 where an oxide (detail omitted for clarity) between the polysilicon layers is thinner than normal interlayer oxides. Beneath the capacitor 100 is a well 104 that is diffused into the silicon substrate 102. The well 104 is normally connected to a low impedance, low noise point in the circuit to help shield the capacitor from substrate noise. The polysilicon layers 106 and 108 are connected to a metal routing layer (metal 1) that is used to connect the capacitor 100 to other circuit elements or bond pads within the integrated circuit. Contact 114 connects the bottom polysilicon layer 106 to a first metal 1 routing track 110, and contact 116 connects the top polysilicon layer 108 to a second metal 1 routing track 112.

FIG. 2 illustrates a top view of the semiconductor layers forming a standard poly-poly capacitor in an integrated circuit. As shown and described above in connection with FIG. 1, the first metal 1 routing track 110 is connected to the bottom polysilicon layer 106 by way of contact 114. The second metal 1 routing track 112 is connected to the top polysilicon layer 108 by way of contact 116. Beneath the capacitor 100 formed by polysilicon layers 106 and 108 is the well 104 that is diffused into the silicon substrate 102.

SUMMARY

The present invention provides for a semiconductor device having a plurality of layers and a capacitor array. In exemplary embodiments, the plurality of layers may include three metal layers, two polysilicon layers, and one via layer. The capacitor array includes a plurality of individual capacitors. At least one of the plurality of layers in the semiconductor device is a via layer configured to determine the connections and capacitances of the plurality of individual capacitors in the capacitor array. The semiconductor device may also include a plurality of circuit elements.

In some embodiments, a metal structure is disposed within the semiconductor device to provide an electromagnetic shield for at least one of the plurality of individual capacitors in the capacitor array. The metal structure may be a metal layer that is connected to ground.

DESCRIPTION

It is to be understood that the present invention is not limited to the example embodiments disclosed herein. The meaning of certain terms as used in the context of this disclosure should be understood as follows. The term "metal layer" refers to any layers that are used to make connections between various elements within a device. The metal layers may contain actual metal routing traces, contacts, or vias. A via may be formed by etching material as defined by a mask layer in the fabrication process or direct exposure to an electron beam. The resulting hole from the etching is then filled by metal and is used to vertically interconnect between metal layers in an integrated circuit. Other terms will either be discussed when introduced, or otherwise should be assumed to have the conventional meaning as understood by persons of ordinary skill in the semiconductor arts.

Figure 1:
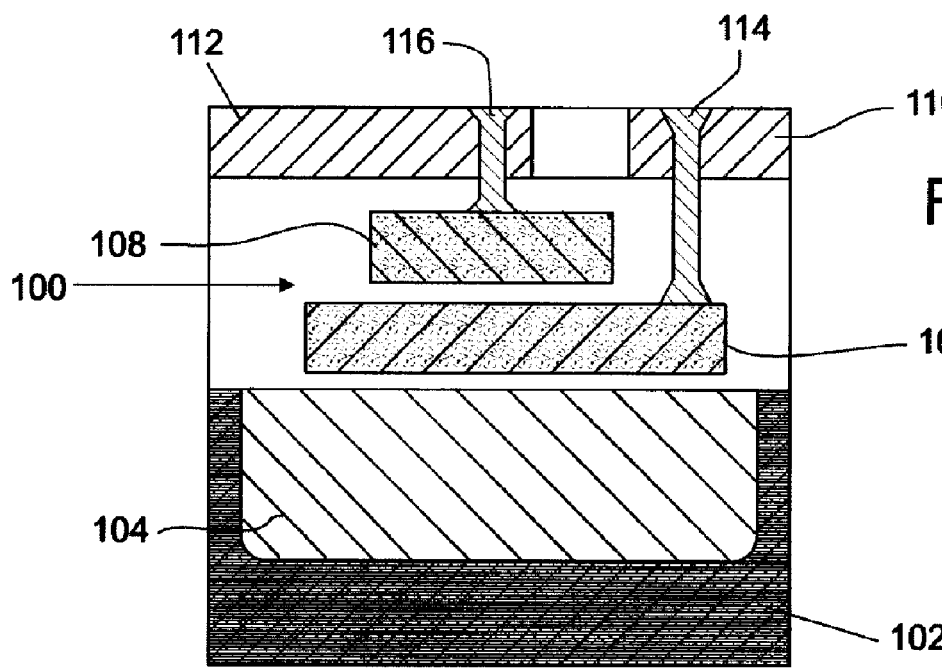
FIG. 1 illustrates a side view of the semiconductor layers forming a standard poly-poly capacitor in an integrated circuit.
Figure 2:
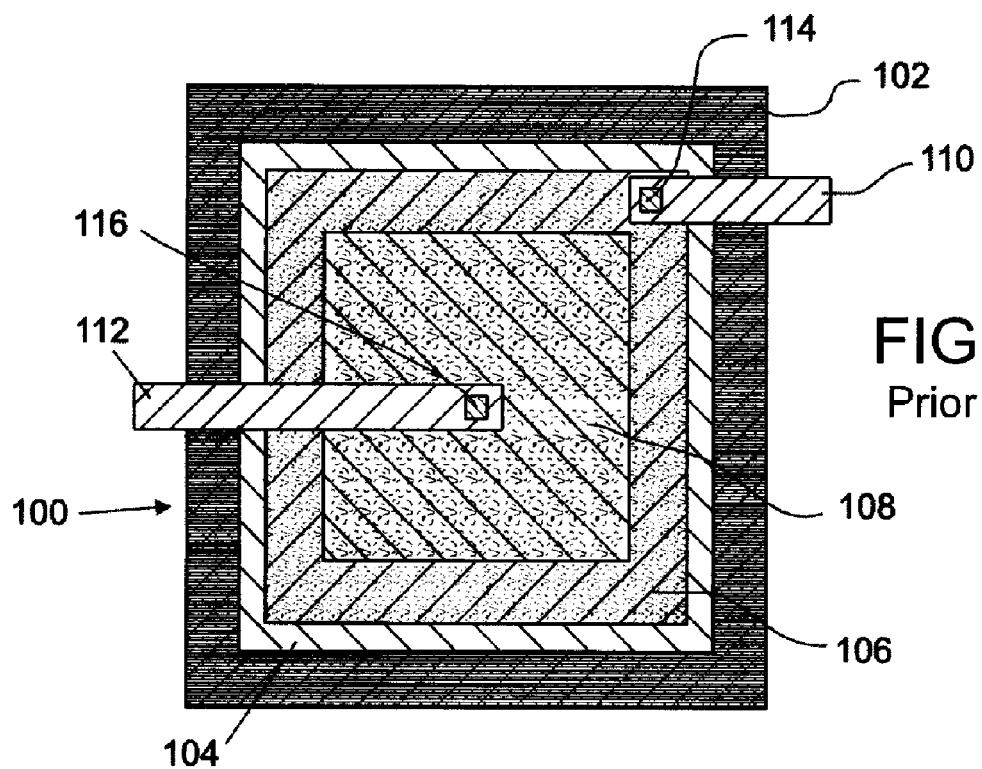
FIG. 2 illustrates a top view of the semiconductor layers forming a standard poly-poly capacitor in an integrated circuit.
Figure 3:
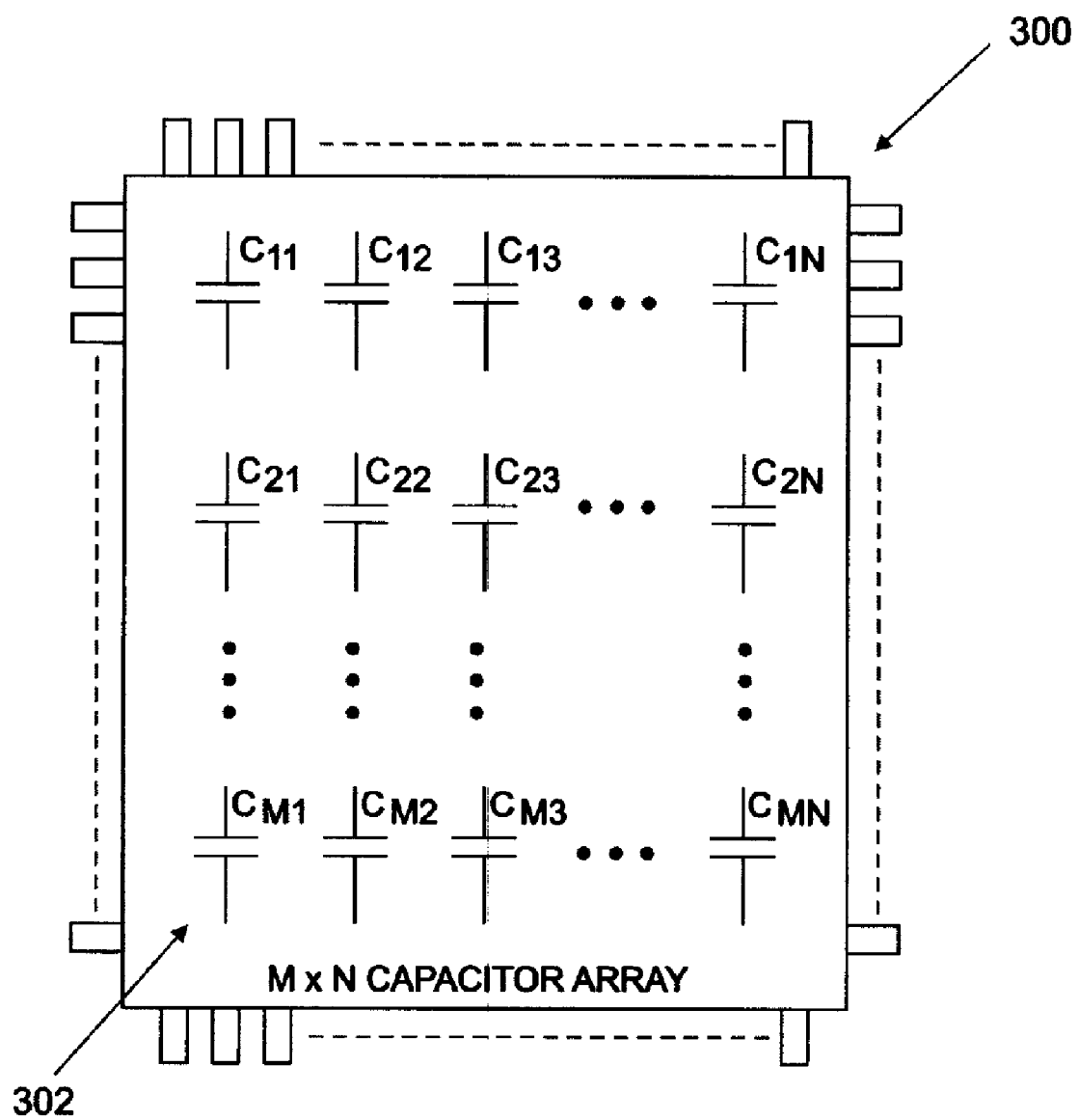
FIG. 3 illustrates an M by N array of capacitors according to at least some embodiments of the present invention.

A semiconductor device according to an embodiment of the present invention comprises a plurality of layers and a capacitor array composed of a plurality individual capacitors that are arranged in an organized manner such as rows and columns. Capacitance value and interconnection of both terminals of the capacitors to other circuit elements is configured by the via layers during the manufacturing process. FIG. 3 illustrates an integrated circuit 300 containing an M by N array 302 of capacitors. The capacitors may be connected together using horizontal and vertical routing tracks. These routing tracks are formed of segmented wires of fixed length that may be connected end-to-end through vias, which are shown in more detail in FIG. 4. The combined capacitors formed by the configuration of the array may be interconnected to other circuit elements or bond pads within the integrated circuit. In one implementation of the invention, a capacitor array may be configured and the signals routed using a single via layer defined by one mask of the manufacturing process. Discussion of the use of via masks and programmable vias to customize a semiconductor device can be found in U.S. Pat. No. 6,580,289, which is incorporated herein by reference.

A device according to the present invention may be realized in various semiconductor processes including but not limited to CMOS, BiCMOS, SiGE, GaAs, and HBT. The individual capacitors of the array may be formed with techniques including but not limited to PIP (polysilicon-insulator-polysilicon) and MIM (metal-insulator-metal). Each capacitor has two metal contacts with one on the top plate and the other on the bottom plate. Each capacitor contact may have the related routing defined by vias. While the specific embodiments of the present invention described herein illustrate capacitors comprising two polysilicon layers, any semiconductor process with a means to realize capacitors using various layers, such as for example two metal layers, and other layers for routing and/or shielding can be used.

Figure 4:
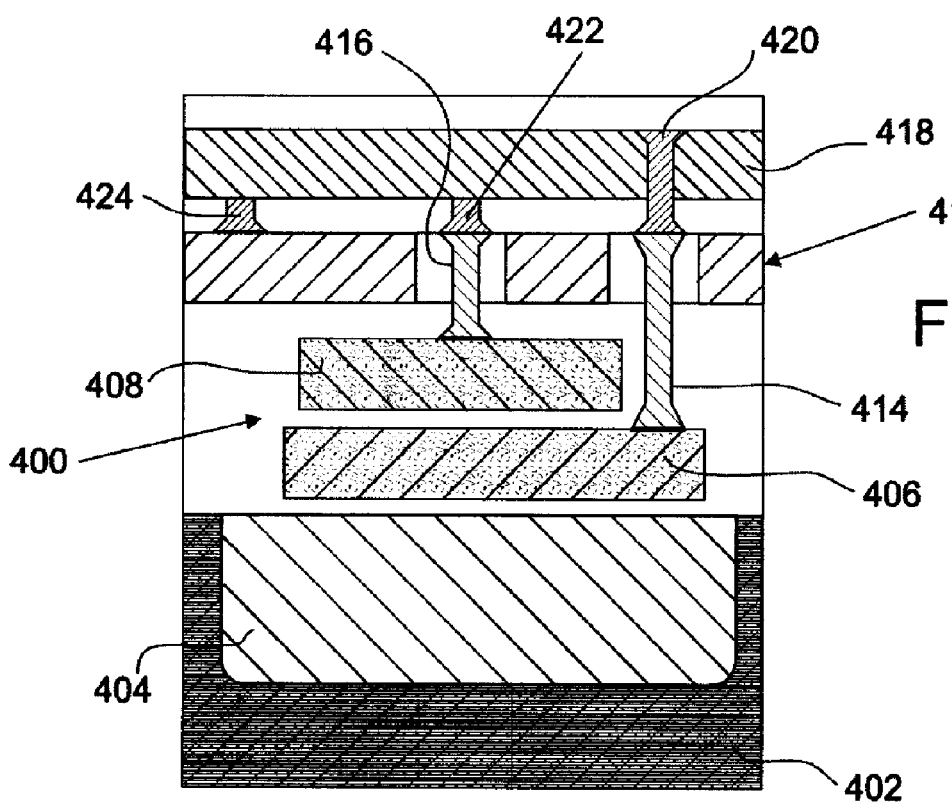
FIG. 4 illustrates a side view of the semiconductor layers forming a poly-poly capacitor according to at least some embodiments of the present invention.

FIG. 4 is an embodiment of the present invention illustrating a side view of the semiconductor layers forming a poly-poly capacitor using a CMOS process. A capacitor 400 is formed by polysilicon layers 406 and 408 where an oxide (detail omitted for clarity) between the polysilicon layers is thinner than normal inter-layer oxides. Beneath the capacitor 400 is a well 404 that is diffused into a silicon substrate 402. The well 404 is connected to a low impedance, low noise point in the circuit, such as analog ground, to help shield the capacitor 400 from substrate noise. The polysilicon layers 406 and 408 are connected to a metal routing layer (metal 2) that is used to connect the capacitor 400 to other circuit elements or bond pads within the integrated circuit. The bottom polysilicon layer 406 is connected to a first metal 2 routing track 418 by way of contact 414 and via 420. The top polysilicon layer 408 is connected to a second metal 2 routing track 426 (see FIG. 5) by way of contact 416 and via 422.

A semiconductor device according to the present invention may include an arrangement of the capacitor array relative to a metal structure that provides electromagnetic shielding of the capacitor array or an individual capacitor within the capacitor array from other layers of the integrated circuit. The shielding allows signals to be routed above and/or below the capacitor array resulting in higher utilization of the integrated circuit area.

When using a capacitor array, parasitic capacitances can result from the signal routing that is used to interconnect the individual capacitors. In order to minimize the effects of these parasitic capacitances, a shield can be formed over the capacitor 400 using a metal shield layer (metal 1) 410. Openings are provided in the metal shield layer 410 that allow the top polysilicon layer 408 and the bottom polysilicon layer 406 to connect to the metal 2 layer for routing purposes. The metal shield layer 410 is connected to a low impedance, low noise point in the circuit, such as analog ground, by way of via 424 and a third metal 2 routing track 428 (see FIG. 5).

Figure 5:
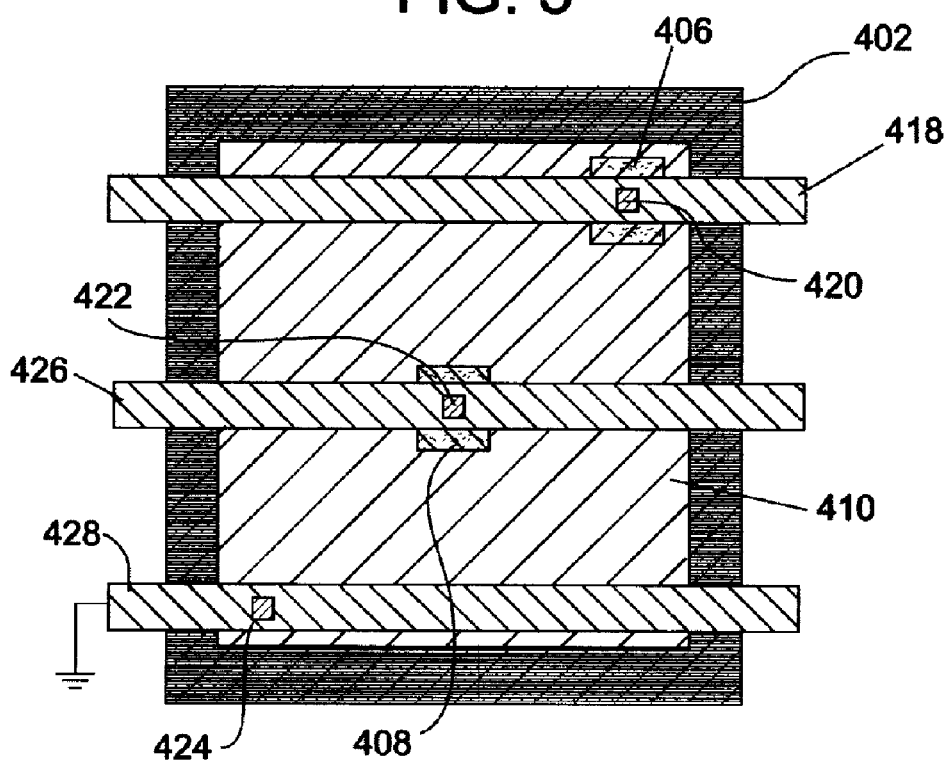
FIG. 5 illustrates a top view of the semiconductor layers forming a poly-poly capacitor according to at least some embodiments of the present invention.

FIG. 5 illustrates a top view of the semiconductor layers of a poly-poly capacitor as shown and described in connection with FIG. 4. The first metal 2 routing track 418 is connected through the opening in the metal shield layer 410 to the bottom polysilicon layer 406 by way of via 420 and contact 414 (see FIG. 4). The second metal 2 routing track 426 is connected through the opening in the metal shield layer 410 to the top polysilicon layer 408 by way of via 422 and contact 416 (see FIG. 4). The third metal 2 routing track 428 is connected to ground and the metal shield layer 410 by way of via 424. Beneath the capacitor 400 formed by polysilicon layers 406 and 408 is the well 404 (see FIG. 4) that is diffused into the silicon substrate 402.

Figure 6:
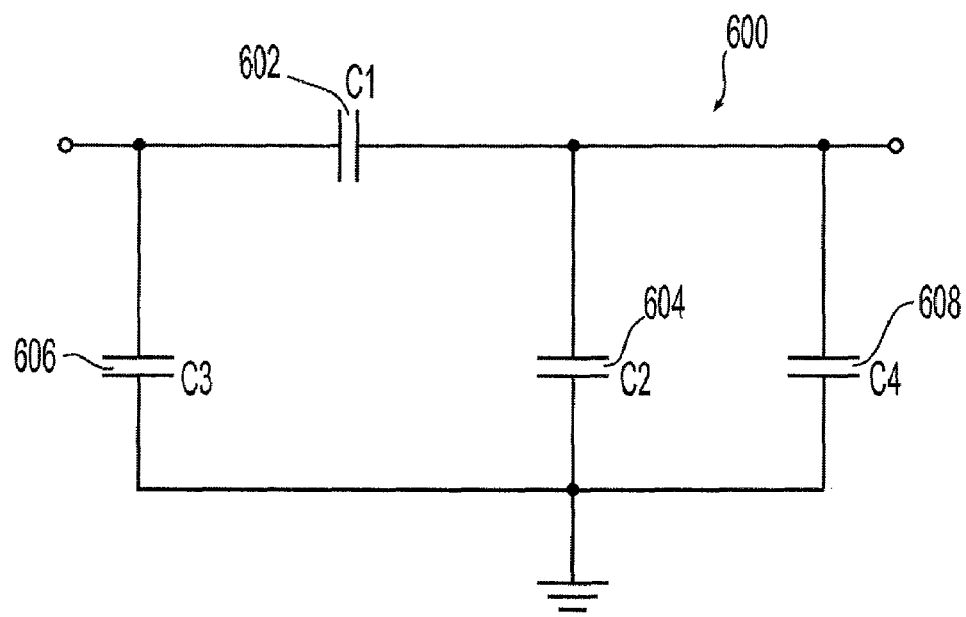
FIG. 6 provides a schematic diagram representing the parasitic capacitances formed by a metal shield according to at least some embodiments of the present invention.

FIG. 6 provides a symbolic representation of the parasitic capacitances formed by the shield using the metal shield layer as shown and described in connection with FIG. 4. Capacitor 602 (C1) represents the capacitor formed by the polysilicon layers 406 and 408 (see FIG. 4). Capacitor 604 (C2) represents the parasitic capacitance formed by the metal shield layer 410 and the top polysilicon layer 408 (see FIG. 4). Capacitor 606 (C3) represents the parasitic capacitance formed by the metal shield layer 410 and the bottom polysilicon layer 406 (see FIG. 4). Capacitor 608 (C4) represents the parasitic capacitance formed by the bottom polysilicon layer 406 and the well 404 (see FIG. 4). As shown in FIG. 6, all of the parasitic capacitances are connected to ground, which allows for the effective utilization of the shield in parasitic insensitive switched capacitor circuits where any capacitance to ground is effectively cancelled. Using a shielded capacitor as shown and described in FIGS. 4 and 5, it is possible to create a capacitor array with more flexibility in the routing of signals.

Figure 7:
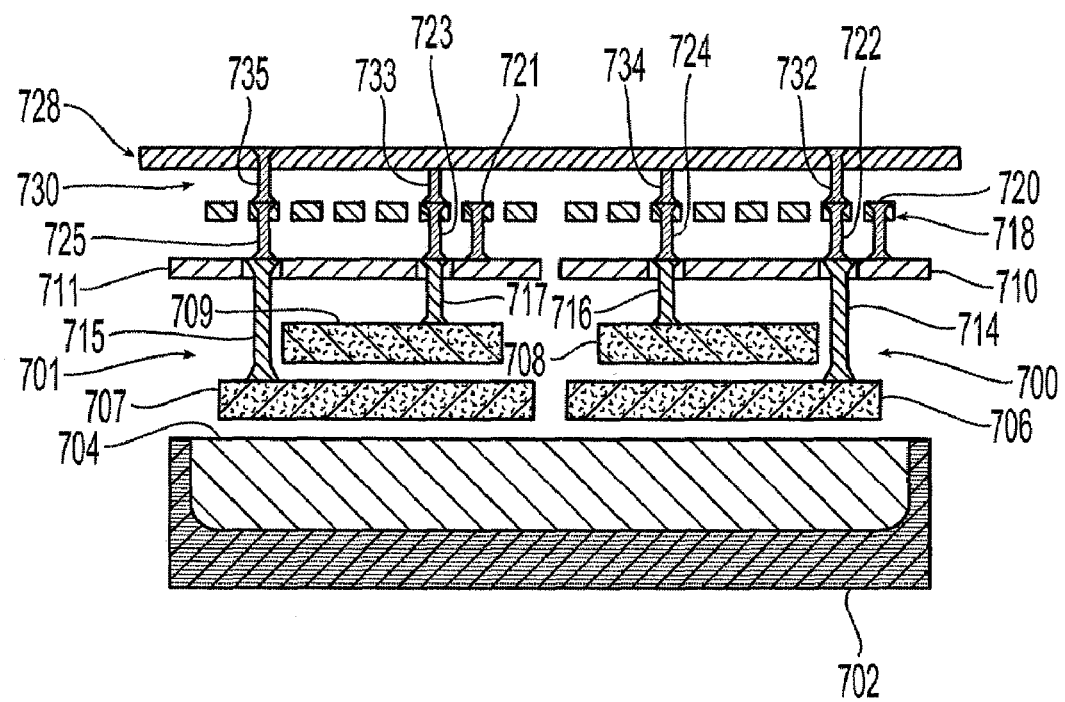
FIG. 7 illustrates a side view of the semiconductor layers forming two adjacent shielded capacitors according to at least some embodiments of the present invention.

FIG. 7 is an embodiment of the present invention illustrating a side view of the semiconductor layers forming two adjacent shielded capacitors. A first capacitor 700 is formed by polysilicon layers 706 and 708 where an oxide (detail omitted for clarity) between the polysilicon layers is thinner than normal inter-layer oxides. Beneath the capacitor 700 is a well 704 that is diffused into a silicon substrate 702. The well 704 is connected to a low impedance, low noise point in the circuit, such as analog ground, to help shield the capacitor 700 from substrate noise. The polysilicon layers 706 and 708 are connected to a first metal routing layer (metal 2) that is used to connect the capacitor 700 to other circuit elements or bond pads within the integrated circuit. The bottom polysilicon layer 706 is connected to one of the metal 2 routing tracks 718 by way of contact 714 and via 722. The top polysilicon layer 708 is connected to at least one of the metal 2 routing tracks 718 by way of contact 716 and via 724. To provide maximum routing flexibility within the integrated circuit, a second metal routing layer (metal 3) is provided. The metal 2 and metal 3 layers maybe interconnected using a programmable via layer 730. In support of the first capacitor 700. the programmable via layer 730 includes via 732 stacked atop via 722 and connecting to metal 3 routing track 728, and partially hidden via 734 stacked atop via 724 connecting to another (hidden) metal 3 routing track (compare with via 420 stacked atop contact 414 and partially hidden via 422 stacked atop contact 416. in FIGS. 4 & 5).

Segments of a metal shield layer (metal 1) are used to form a shield for the individual capacitors. The shield is formed over the first capacitor 700 using a first metal 1 shield segment 710. Openings are provided in the metal 1 shield segment 710 that allow the top polysilicon layer 708 and the bottom polysilicon layer 706 of the first capacitor 700 to be connected to the metal 2 layer for routing purposes. The first metal 1 shield segment 710 is connected to a low impedance, low noise point in the circuit, such as analog ground, by way of via 720 and at least one of the metal 2 routing tracks 718. While the metal shield layer in this embodiment is shown as being divided into a plurality of segments that are used to shield various individual capacitors, the metal shield layer may be one complete or partial layer over the entire device or capacitor array or a portion thereof.

A second capacitor 701 is formed by polysilicon layers 707 and 709 where an oxide (detail omitted for clarity) between the polysilicon layers is thinner than normal interlayer oxides. Beneath the capacitor 701 is the well 704 that is diffused into the silicon substrate 702. The polysilicon layers 707 and 709 are connected to the first metal routing layer (metal 2) that is used to connect the capacitor 701 to the other circuit elements or bond pads within the integrated circuit. The bottom polysilicon layer 707 is connected to at least one of the metal 2 routing tracks 718 by way of contact 715 and via 725. The top polysilicon layer 709 is connected to at least one of the metal 2 routing tracks 718 by way of contact 717 and via 723. In support of the second capacitor 701, the programmable via layer 730 includes via 735 stacked atop via 725 and connecting to metal 3 routing track 728, and partially hidden via 733 stacked atop via 723 and connecting to another (hidden) metal 3 routing track (compare with via 420 stacked atop contact 414 and partially hidden via 422 stacked atop contact 416, in FIGS. 4 & 5). As a result, capacitors 700 and 701 are connected in parallel with their bottom polysilicon layers 706, 707 connected to common metal 3 routing track 728 and their top polysilicon layers 708, 709 connected to another (hidden) common metal 3 routing track.

A shield is formed over the second capacitor 701 using a second metal 1 shield segment 711. Openings are provided in the second metal 1 shield segment 711 that allow the top polysilicon layer 709 and the bottom polysilicon layer 707 of the second capacitor 701 to be connected to the metal 2 layer for routing purposes. The second metal 1 shield segment 711 is connected to a low impedance, low noise point in the circuit, such as analog ground, by way of via 721 and at least one of the metal 2 routing tracks 718.

Figure 8:
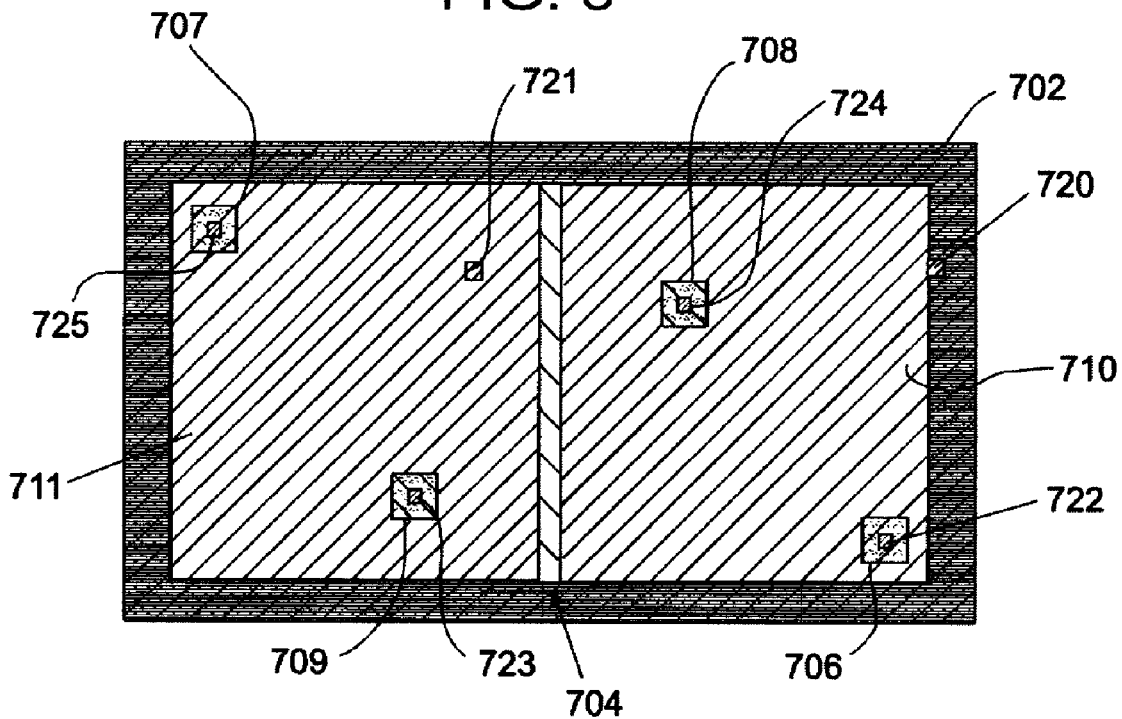
FIG. 8 illustrates a top view of the metal 1 layer of two adjacent shielded capacitors according to at least some embodiments of the present invention.
Figure 9:
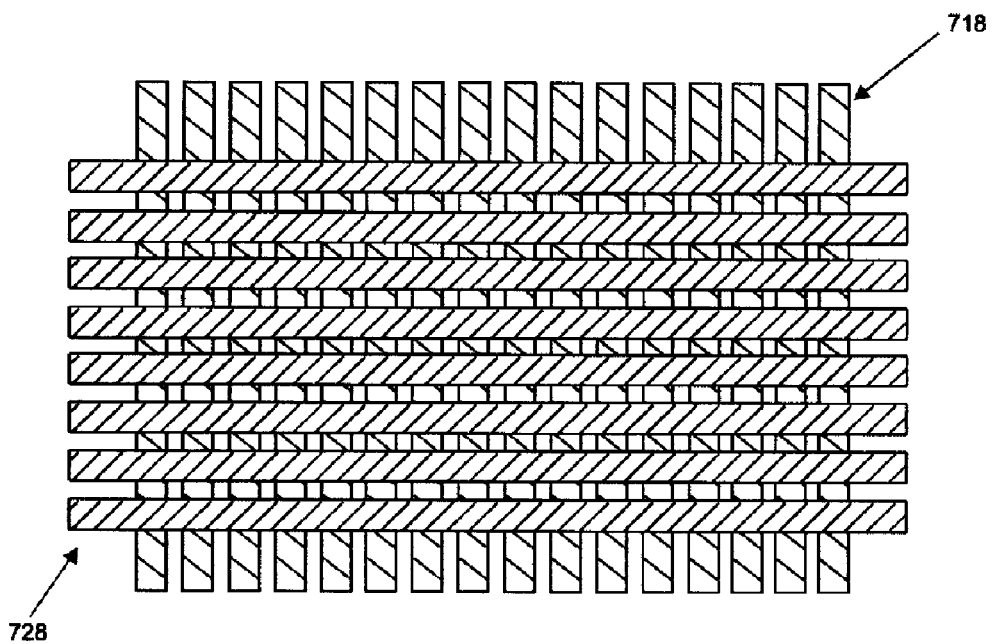
FIG. 9 illustrates a top view of the metal 2 and 3 layers of two adjacent shielded capacitors according to at least some embodiments of the present invention.

FIGS. 8 and 9 illustrate a top view of the semiconductor layers forming two adjacent shielded capacitors as shown and described in connection with FIG. 7. The two adjacent shielded capacitors form a 1×2 capacitor tile. FIG. 9 illustrates the metal 2 routing tracks 718 and the metal 3 routing tracks 728 that may be used to connect capacitors 700 and 701 (see FIG. 7) to each other or to other circuit elements or bond pads within the integrated circuit. In the embodiment as shown, there is a routing grid of sixteen vertical metal 2 routing tracks 718 that run perpendicular to eight horizontal metal 3 routing tracks 728, which forms a routing fabric. All of the direct connections are made to the capacitors 700 and 701 using the metal 2 routing tracks 718. The remaining metal 2 routing tracks 718 and all of the metal 3 routing tracks 728 can be used for signal routing. The interconnections between the metal 2 and metal 3 layers may be accomplished using vias, such as the programmable vias described in connection with FIG. 7, where the vertical and horizontal routing tracks cross each other. Thus, FIG. 7, FIG. 8, and FIG. 9 together illustrate both a structure and a method of assembling example embodiments of the invention. Using programmable vias to interconnect the metal 2 and metal 3 layers can be automated; therefore, no manual signal routing may be required.

In FIG. 8, the polysilicon layers 706 and 708 of the first capacitor 700 (see FIG. 7) and the polysilicon layers 707 and 709 of the second capacitor 701 (see. FIG. 7) are connected to the metal 2 routing tracks 718 (see. FIG. 9) that may be used to connect the first capacitor 700 and the second capacitor 701 to each other or to other circuit elements or bond pads within the integrated circuit. At least one of the metal 2 routing tracks 718 is connected through an opening in the first metal 1 shield segment 710 to the bottom polysilicon layer 706 by way of via 722 and contact 714 (see FIG. 7). At least one of the metal 2 routing tracks 718 is connected through an opening in the first metal 1 shield segment 710 to the top polysilicon layer 708 by way of via 724 and contact 716 (see FIG. 7). Additionally, at least one of the metal 2 routing tracks 718 is connected to ground and the first metal 1 shield segment 710 by way of via 720. Beneath the capacitors 700 and 701 is the well 704 (see FIG. 7) that is diffused into the silicon substrate 702. At least one of the metal 2 routing tracks 718 is connected through an opening in the second metal 1 shield segment 711 to the bottom polysilicon layer 707 by way of via 725 and contact 715 (see FIG. 7). At least one of the metal 2 routing tracks 718 is connected through an opening in the second metal 1 shield segment 711 to the top polysilicon layer 709 by way of via 723 and contact 717 (see FIG. 7). At least one of the metal 2 routing tracks 718 is connected to ground and the second metal 1 shield segment 711 by way of via 721.

Figure 10:
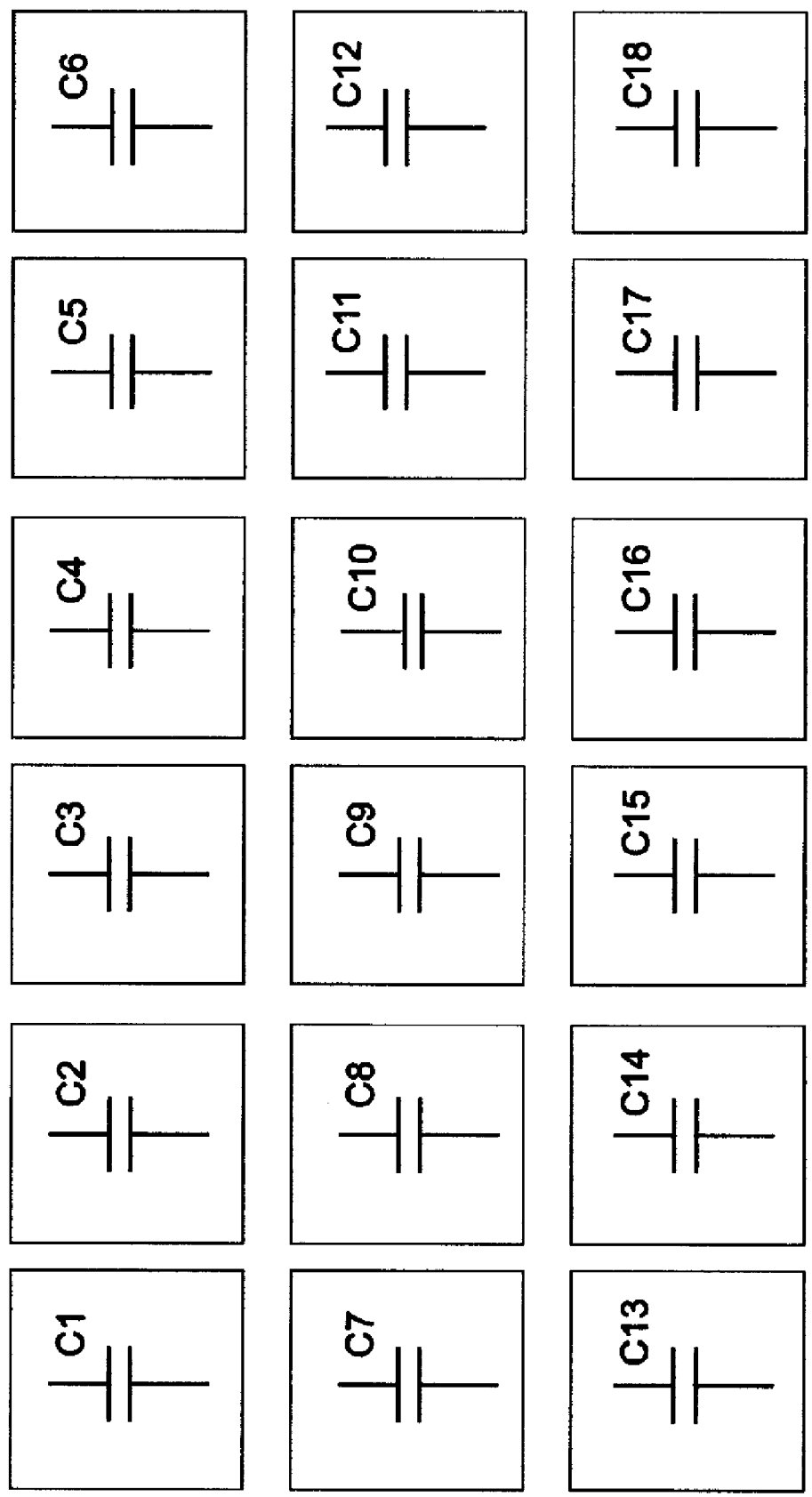
FIG. 10 illustrates an array of capacitors according to at least some embodiments of the present invention.
Figure 11:
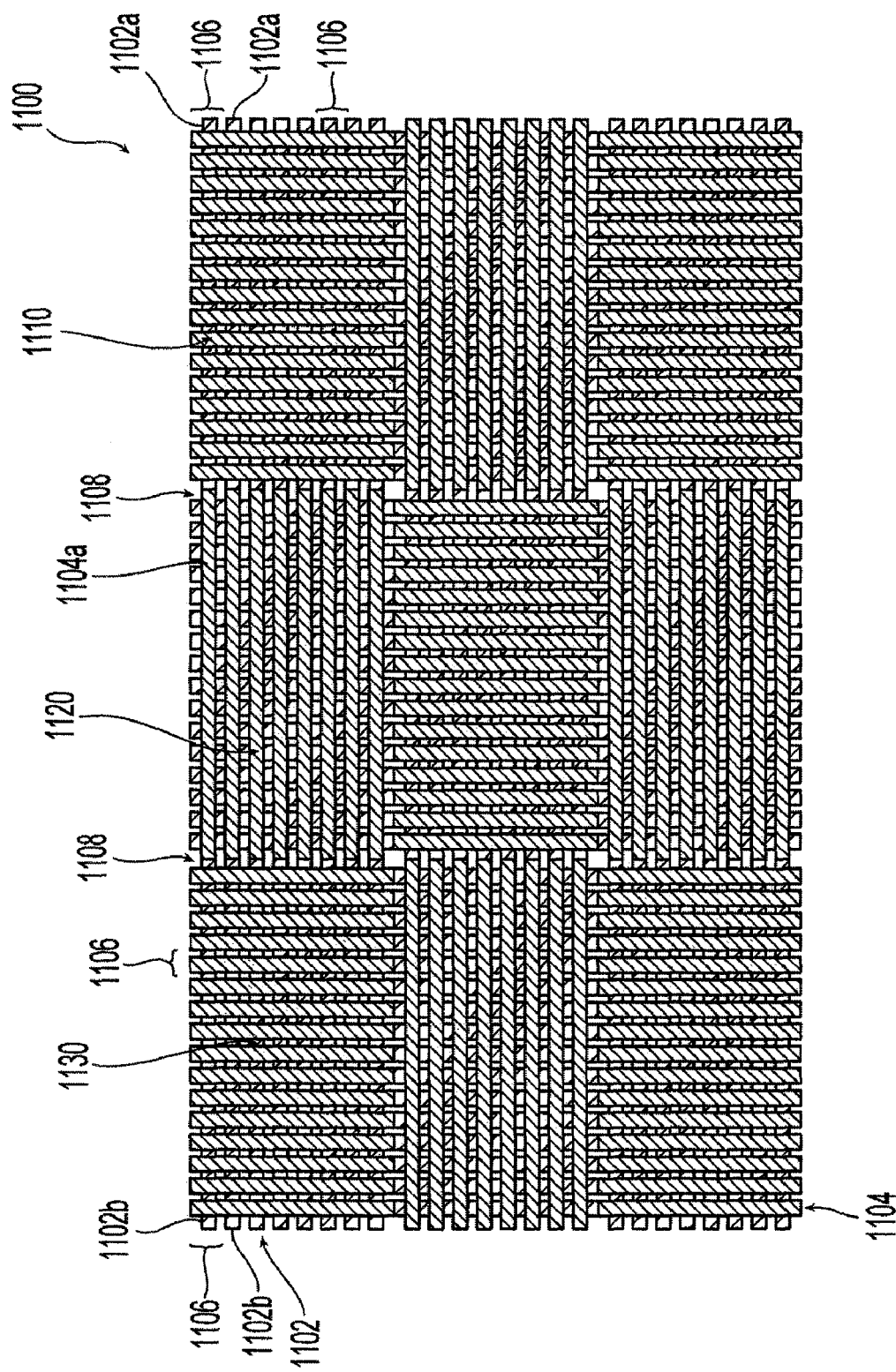
FIG. 11 illustrates the metal 2 and 3 layers of an array of capacitors according to at least some embodiments of the present invention.

FIGS. 10 and 11 illustrate an array of capacitors formed using multiple 1×2 capacitor tiles. As shown and described in connection with FIGS. 7, 8 and 9 above, two adjacent shielded capacitors may be used to form a 1×0.2 capacitor tile. FIGS. 10 and 11 illustrate how the 1×2 capacitor tiles can be arranged into an array of any practical size (typically less than 1000 units) by simply alternating the orientation of the metal 2 and metal 3 routing tracks. FIG. 10 illustrates an arrangement of capacitors 1000 such as those shown and described in connection with FIG. 7 above. A routing fabric 1100 is illustrated in FIG. 11. The routing fabric 1100 is composed of 1×2 capacitor tiles wherein the orientation of the metal 2 routing tracks 1102 is alternated from one capacitor tile to the next to permit the routing of signals throughout the array. The metal 3 routing tracks 1104 are also alternated from one capacitor tile to the next for the same purpose. As seen in the top view of FIG. 11, in routing fabric 1100, the metal 2 routing tracks 1102a associated with one capacitor tile 1110 are aligned with the metal 3 routing tracks 1104a associated with an adjacent capacitor tile 1120, and the metal 3 routing tracks 1104a associated with capacitor tile 1120 are aligned with the metal 2 routing tracks 1102b associated with adjacent capacitor tile 1130. Thus, in the top view, routing fabric 1100 comprises rows 1106 of collinear routing tracks extending in both directions, with adjacent aligned routing tracks meeting at junctions 1108. To permit the routing of signals throughout the array. connections are formed in the aforementioned via layer at these junctions 1108.

Specific embodiments of an invention are described herein. One of ordinary skill in the semiconductor arts will quickly recognize that the invention has other applications in other environments. In fact, many embodiments and implementations are possible. The following claims are in no way intended to limit the scope of the invention to the specific embodiments described above.

What is claimed is:

1. A semiconductor device comprising:
a capacitor array comprising a plurality of capacitor tiles, each capacitor tile comprising at least one capacitor;

a first plurality of first metal routing tracks overlaying the at least one capacitor of each capacitor tile;

a second plurality of second metal routing tracks also overlaying the at least one capacitor of each capacitor tile, with the second metal routing tracks crossing over the first metal routing tracks;

an orientation of the first metal routing tracks being alternated from one capacitor tile to the next; and an orientation of the second metal routing tracks being alternated from one capacitor tile to the next;

each capacitor within a capacitor tile having: a first electrical connection to a first of said first metal routing tracks and a second electrical connection to a second of said first metal routing tracks; and a plurality of vias all belonging to a single layer within the semiconductor device, said plurality of vias connecting some of the second metal routing tracks to some of the first metal routing tracks, such that capacitors belonging to different capacitor tiles are electrically connected to one another by the second metal routing tracks to thereby form a combined capacitor.

2. The semiconductor device according to claim 1, wherein:
each capacitor tile comprises two capacitors arranged in a 1×2 configuration.

3. The semiconductor device according to claim 1, wherein:
said plurality of vias are located where the second metal routing tracks cross over the first routing tracks.

4. The semiconductor device according to claim 1, wherein:
in a top view:
the first metal routing tracks associated with one capacitor tile are aligned with the second metal routing tracks associated with an adjacent capacitor tile, such that the device comprises rows of collinear routing tracks.

5. The semiconductor device according to claim 4, wherein:
in said top view:
adjacent collinear routing tracks meet at junctions where connections are formed in said single layer to thereby permit routing of signals throughout the capacitor array.

6. The semiconductor device according to claim 1, wherein:
the first metal routing tracks associated with a given capacitor tile are all parallel to one another and have a first orientation; and
the second metal routing tracks associated with said given capacitor tile are all parallel to one another and have a second orientation, the second orientation being perpendicular to the first orientation.

7. The semiconductor device according to claim 1, further comprising:
a metal structure disposed to provide an electromagnetic shield for a plurality of said capacitor tiles.

8. The semiconductor device according to claim 7, wherein:
the metal structure is connected to ground.

9. The semiconductor device according to claim 7, wherein:
the metal structure comprises a metal layer.

10. The semiconductor device according to claim 7, wherein each of said first and second electrical connections comprises:
a contact from a polysilicon layer of an individual capacitor to the metal structure; and a via from the metal structure to one of said first metal routing tracks.

11. The semiconductor device according to claim 1, comprising:
a plurality of layers including at least three metal layers, at least two polysilicon layers, and said single via layer.

12. The semiconductor device according to claim 1, further comprising:
a plurality of circuit elements.

13. The semiconductor device according to claim 1, wherein: the device is an integrated circuit.

14. A semiconductor device comprising:
a two-dimensional arrangement of capacitor tiles, each capacitor tile comprising:
at least one capacitor;
a first plurality of first metal routing tracks overlaying the at least one capacitor;
a second plurality of second metal routing tracks also overlaying the at least one capacitor, with the second metal routing tracks crossing over the first metal routing tracks,
a first electrical connection from said at least one capacitor to a first of said first metal routing tracks; and
a second electrical connection from said at least one capacitor to a second of said first metal routing tracks;
wherein:
an orientation of the first metal routing tracks is alternated from one capacitor tile to the next;
an orientation of the second metal routing tracks is alternated from one capacitor tile to the next; and
a plurality of vias all belonging to a single layer within the semiconductor device connect some of the second metal routing tracks to some of the first metal routing tracks, such that capacitors belonging to different capacitor tiles are electrically connected to one another by the second metal routing tracks to thereby form a combined capacitor.

15. The semiconductor device according to claim 14, wherein:
each capacitor tile comprises two capacitors arranged in a 1×2 configuration.

16. The semiconductor device according to claim 14, wherein:
said plurality of vias are located where the second metal routing tracks cross over the first routing tracks.

17. The semiconductor device according to claim 14, wherein:
in a top view:
the first metal routing tracks associated with one capacitor tile are aligned with the second metal routing tracks associated with an adjacent capacitor tile, such that the device comprises rows of collinear routing tracks.

18. The semiconductor device according to claim 17, wherein:
in said top view:
adjacent collinear routing tracks meet at junctions where connections are formed in said single layer to thereby permit routing of signals throughout the capacitor array.

19. The semiconductor device according to claim 14, wherein:
the first metal routing tracks associated with a given capacitor tile are all parallel to one another and have a first orientation; and the second metal routing tracks associated with said given capacitor tile are all parallel to one another and have a second orientation, the second orientation being perpendicular to the first orientation.

20. The semiconductor device according to claim 14, further comprising:

a metal structure disposed to provide an electromagnetic shield for a plurality of said capacitor tiles.

21. The semiconductor device according to claim 20, wherein:

the metal structure is connected to ground.

22. The semiconductor device according to claim 20, wherein:

the metal structure comprises a metal layer.

23. The semiconductor device according to claim 20, wherein each of said first and second electrical connections comprises:

a contact from a polysilicon layer of an individual capacitor to the metal structure; and a via from the metal structure to one of said first metal routing tracks.

24. The semiconductor device according to claim 14, comprising:

a plurality of layers including at least three metal layers, at least two polysilicon layers, and said single via layer.

25. The semiconductor device according to claim 14, further comprising:

a plurality of circuit elements.

26. The semiconductor device according to claim 14, wherein:

the device is an integrated circuit.

* * * * *